United States Patent
Asano

(10) Patent No.: US 7,405,566 B2
(45) Date of Patent: Jul. 29, 2008

(54) RF PULSE APPLYING METHOD AND MRI APPARATUS

(75) Inventor: Kenji Asano, Tokyo (JP)

(73) Assignee: GE Medical Systems Technology Company, LLC, Waukesha, WI (US)

(*) Notice: Subject to any disclaimer, the term of this patent is extended or adjusted under 35 U.S.C. 154(b) by 79 days.

(21) Appl. No.: 11/470,821

(22) Filed: Sep. 7, 2006

(65) Prior Publication Data
US 2007/0052415 A1  Mar. 8, 2007

(30) Foreign Application Priority Data
Sep. 8, 2005  (JP) ............... 2005-260042

(51) Int. Cl.
*G01V 3/00* (2006.01)
(52) U.S. Cl. ..................... 324/314; 324/309
(58) Field of Classification Search ............... 324/314, 324/309, 307, 300
See application file for complete search history.

(56) References Cited

U.S. PATENT DOCUMENTS

| | | | |
|---|---|---|---|
| 4,532,474 A | | 7/1985 | Edelstein |
| 4,710,718 A | * | 12/1987 | Shaka ............... 324/309 |
| 5,285,159 A | * | 2/1994 | Bodenhausen et al. ...... 324/314 |
| 5,537,039 A | | 7/1996 | Le Roux et al. |
| 6,587,708 B2 | | 7/2003 | Venkatesan et al. |
| 6,853,192 B2 | * | 2/2005 | Heid ............... 324/314 |
| 6,956,374 B2 | * | 10/2005 | Busse ............... 324/314 |
| 6,968,225 B2 | | 11/2005 | Vu |
| 7,078,900 B2 | | 7/2006 | Vu |

FOREIGN PATENT DOCUMENTS

| | | |
|---|---|---|
| JP | 2004-237102 | 8/2004 |
| JP | 2004-329268 | 11/2004 |

OTHER PUBLICATIONS

Klaus Scheffler, et al.; Magnetization Preparation During the Steady State: FAT-Saturated 3D TrueFISP; Magnetic Resonance in Medicine 45:1075-1080 (2001).

* cited by examiner

*Primary Examiner*—Louis M Arana
(74) *Attorney, Agent, or Firm*—Armstrong Teasdale LLP

(57) ABSTRACT

The effects of prior pulses are to be enhanced. A pulse string which monotonically decreases the flip angle is inserted between the prior pulse in one round and the imaging pulse in the previous round, and a pulse string which monotonically increases the flip angle is inserted between the prior pulse and the imaging pulse in one round. A return from the steady state to the equilibrium state can be achieved not only for on-resonance magnetization but also for off-resonance magnetization before the prior pulse is applied. Therefore, the effects of the prior pulse P can be fully attained. Further, not only on-resonance magnetization but also off-resonance magnetization can be brought close to the steady state before the imaging pulse is applied.

20 Claims, 3 Drawing Sheets

MRI apparatus
100

RF PULSE APPLYING METHOD AND MRI APPARATUS

CROSS REFERENCE TO RELATED APPLICATIONS

This application claims the benefit of Japanese Application No. 2005-260042 filed Sep. 8, 2005.

BACKGROUND OF THE INVENTION

The present invention relates to an RF (radio frequency) pulse applying method and an MRI (magnetic resonance imaging) apparatus, and more particularly to an RF pulse applying method and an MRI apparatus which can serve to enhance the effects of prior pulses.

Conventionally, there is known a technique by which data collection by applying imaging pulses of an SSFP (steady-state free precession) sequence is repeated after applying a SPEC-IR (spectral-inversion recovery) pulse, and at the same time a pulse having a flip angle half as wide as the flip angle of the imaging pulse is inserted between a SPEC-IR pulse and the following imaging pulse and between an imaging pulse and the following SPEC-IR pulse (see Non-Patent Document 1 for instance).

There is also known a magnetic resonance imaging apparatus which inserts a pulse string to increase the flip angle before applying an imaging pulse (see Patent Document 2 for instance).

There is further known a method of excitation during an NMR examination by which a pulse string to increase the flip angle with a prescribed amplitude curve is inserted before applying an imaging pulse and, after applying the imaging pulse, a pulse string to decrease the flip angle with a prescribed amplitude curve is inserted (see Patent Document 3 for instance).

[Non-Patent Document 1] Magnetic Resonance in Medicine 45: 1075-1080 (2001)

[Patent Document 2] JP-A No. 2004-329268 (Claim 1, FIG. 3)

[Patent Document 3] JP-A No. 2004-237102 ([0036], FIG. 8)

In the prior art described in Patent Document 1 above, magnetization is brought close to its steady state by inserting a pulse having a flip angle half as wide as the flip angle of the imaging pulse between a SPEC-IR pulse and the following imaging pulse and magnetization is returned from its steady state to the equilibrium state by inserting a pulse having a flip angle half as wide as the flip angle of the imaging pulse between the imaging pulse and the following SPEC-IR pulse.

However, this method of inserting a pulse having a flip angle half as wide as the flip angle of the imaging pulse is not very effective for off-resonance magnetization, as described in "Proc. 8th ISMRM., 1:301 (2000)" for instance, both in bringing the magnetization close to its steady state or returning the magnetization from its steady state to the equilibrium state. As a consequence, there arise such problems as a failure to achieve the desired effect on account of the influence of an uneven magnetostatic field or a failure to achieve the desired effect in the tissue of either water or fat on account of a difference in resonance frequency between water and fat.

Incidentally, neither of the techniques described in Patent Document 2 and Patent Document 3 cited above does not concern a pulse sequence in which prior pulses are applied.

SUMMARY OF THE INVENTION

Therefore, an object of the present invention is to provide an RF pulse applying method and an MRI apparatus which can serve to enhance the effects of prior pulses where application of a prior pulse before applying an imaging pulse is repeated.

The invention, according to its first aspect, provides an RF pulse applying method wherein collection of data for imaging is repeated by applying an imaging pulse after the application of a prior pulse, and a flip angle monotonically decreasing pulse string is inserted between the imaging pulse and the prior pulse that follows.

By the RF pulse applying method according to the first aspect described above, a pulse string which monotonically decreases the flip angle is inserted between a prior pulse in one round and an imaging pulse in the previous round. This enables a return from the steady state to the equilibrium state to be achieved not only for on-resonance magnetization but also for off-resonance magnetization before the prior pulse is applied. Therefore, the effects of prior pulses can be fully attained. Suppression of the loss of signals from a tissue to be imaged (e.g. water) or signals from a tissue not be imaged (e.g. fat) can well be achieved by prior pulses.

Incidentally, regarding the type of the prior pulse, there is a description, for instance, in Tsutomu Araki and Kazuro Sugimura, ed., *MRI/CT Yogo Jiten* (Dictionary of MRI and CT Terms), First Edition, Kabushiki Kaisha Medical View Sha, issued on Nov. 10, 2000, p. 101.

The invention, according to its second aspect, provides an RF pulse applying method wherein, in the RF pulse applying method according to the first aspect described above, the flip angle monotonically decreasing pulse string is a pulse string which decreases the flip angle modestly in the first phase, decreases the flip angle substantially in the middle phase and decreases the flip angle modestly in the last phase.

By the RF pulse applying method according to the second aspect described above, a smooth return from the steady state to the equilibrium state can be achieved because the flip angle is smoothly decreased.

The invention, according to its third aspect, provides an RF pulse applying method wherein, in the RF pulse applying method according to the first aspect described above, the flip angle monotonically decreasing pulse string is a pulse string which linearly decreases the flip angle.

By the RF pulse applying method according to the second aspect described above, processing is simplified because the flip angle is linearly decreased.

The invention, according to its fourth aspect, provides an RF pulse applying method wherein, in the RF pulse applying method according to any of the first through third aspects described above, a flip angle monotonically increasing pulse string which monotonically increases the flip angle is inserted between the prior pulse and the imaging pulse that follows.

By the RF pulse applying method according to the fourth aspect described above, a pulse string which monotonically increases the flip angle is inserted between a prior pulse and an imaging pulse I in one round. This enables not only on-resonance magnetization but also off-resonance magnetization to be brought close to the steady state before the imaging pulse is applied.

The invention, according to its fifth aspect, provides an RF pulse applying method wherein, in the RF pulse applying method according to the fourth aspect described above, the flip angle increasing pattern of the flip angle monotonically increasing pulse string is symmetric to the flip angle decreasing pattern of the flip angle monotonically decreasing pulse string.

By the RF pulse applying method according to the fifth aspect described above, processing is simplified because one of the flip angle decreasing pattern and the flip angle increasing pattern can be converted into the other only by inverting the time axis of one pattern.

The invention, according to its sixth aspect, provides an RF pulse applying method wherein, in the RF pulse applying method according to any of the first through fifth aspects described above, the prior pulse is a SPEC-IR pulse.

By the RF pulse applying method according to the sixth aspect described above, suppression of the loss of signals from water or signals from fat can well be achieved.

The invention, according to its seventh aspect, provides an RF pulse applying method wherein, in the RF pulse applying method according to any of the first through fifth aspects described above, the imaging pulse is an RF pulse of an SSFP sequence.

By the RF pulse applying method according to the seventh aspect described above, a fat suppressing SSFP sequence can be suitably implemented.

The invention, according to its eighth aspect, provides an RF pulse applying method wherein, in the RF pulse applying method according to any of the first through fifth aspects described above, the prior pulse is an IR pulse.

By the RF pulse applying method according to the eighth aspect described above, T1 emphasis can be sufficiently accomplished.

The invention, according to its ninth aspect, provides an RF pulse applying method wherein, in the RF pulse applying method according to any of the first through fifth aspects described above, the prior pulse is a Spatial-Sat pulse.

By the RF pulse applying method according to the ninth aspect described above, signal suppression in a specific spatial region can be sufficiently accomplished.

The invention, according to its 10th aspect, provides an MRI apparatus comprising a prior pulse applying means which applies a prior pulse, an imaging pulse applying means which applies an imaging pulse, and a flip angle monotonically decreasing pulse string applying means which applies a flip angle monotonically decreasing pulse string that monotonically decreases the flip angle between the imaging pulse and the prior pulse that follows.

The MRI apparatus according to the 10th aspect described above can suitably implement the RF pulse applying method according to the first aspect.

The invention, according to its 11th aspect, provides an MRI apparatus wherein, in the MRI apparatus according to the 10th aspect described above, the flip angle monotonically decreasing pulse string applying means decreases the flip angle modestly in the first phase, decreases the flip angle substantially in the middle phase and decreases the flip angle modestly in the last phase.

The MRI apparatus according to the 11th aspect described above can suitably implement the RF pulse applying method according to the third aspect.

The invention, according to the 12th aspect, provides an MRI apparatus wherein, in the MRI apparatus according to the 10th aspect described above, the flip angle monotonically decreasing pulse string applying means linearly decreases the flip angle.

The MRI apparatus according to the 12th aspect described above can suitably implement the RF pulse applying method according to the second aspect.

The invention, according to its 13th aspect, provides an MRI apparatus, in the MRI apparatus according to any of the 10th through 12th aspects described above, comprises a flip angle monotonically increasing pulse string applying means which applies a flip angle monotonically increasing pulse string that monotonically increases the flip angle between the prior pulse and the imaging pulse that follows.

The MRI apparatus according to the 13th aspect described above can suitably implement the RF pulse applying method according to the fourth aspect.

The invention, according to its 14th aspect, provides an MRI apparatus wherein, in the MRI apparatus according to the 13th aspect described above, the flip angle increasing pattern of the flip angle monotonically increasing pulse string is symmetric to the flip angle decreasing pattern of the flip angle monotonically decreasing pulse string.

The MRI apparatus according to the 14th aspect described above can suitably implement the RF pulse applying method according to the fifth aspect.

The invention, according to its 15th aspect, provides an MRI apparatus wherein, in the MRI apparatus according to any of the 10th through 14th aspects described above, the prior pulse is a SPEC-IR pulse.

The MRI apparatus according to the 15th aspect described above can suitably implement the RF pulse applying method according to the sixth aspect.

The invention, according to its 16th aspect, provides an MRI apparatus wherein, in the MRI apparatus according to the 15th aspect described above, the imaging pulse is an RF pulse of an SSFP sequence.

The MRI apparatus according to the 16th aspect described above can suitably implement the RF pulse applying method according to the seventh aspect.

The invention, according to its 17th aspect, provides an MRI apparatus wherein, in the MRI apparatus according to any of the 10th through 14th aspects described above, the prior pulse is an IR pulse.

The MRI apparatus according to the 17th aspect described above can suitably implement the RF pulse applying method according to the eighth aspect.

The invention, according to its 18th aspect, provides an MRI apparatus wherein, in the MRI apparatus according to any of the 10th through 14th aspects described above, the prior pulse is a Spatial-Sat pulse.

The MRI apparatus according to the 18th aspect described above can suitably implement the RF pulse applying method according to the ninth aspect.

The RF pulse applying method and the MRI apparatus according to the present invention can serve to enhance the effects of prior pulses when repeating the application of prior pulses and imaging pulses.

The RF pulse applying method and the MRI apparatus according to the invention can be utilized for obtaining tomograms of the subject by repeating the application of a prior pulse before applying an imaging pulse.

Further objects and advantages of the present invention will be apparent from the following description of the preferred embodiments of the invention as illustrated in the accompanying drawings.

BRIEF DESCRIPTION OF THE INVENTION

DETAILED DESCRIPTION OF THE INVENTION

The present invention will be described in further detail below with reference to the best modes for implementation illustrated in the accompanying drawings. Incidentally, this is nothing to limit the invention.

Embodiment 1

Figure 1:
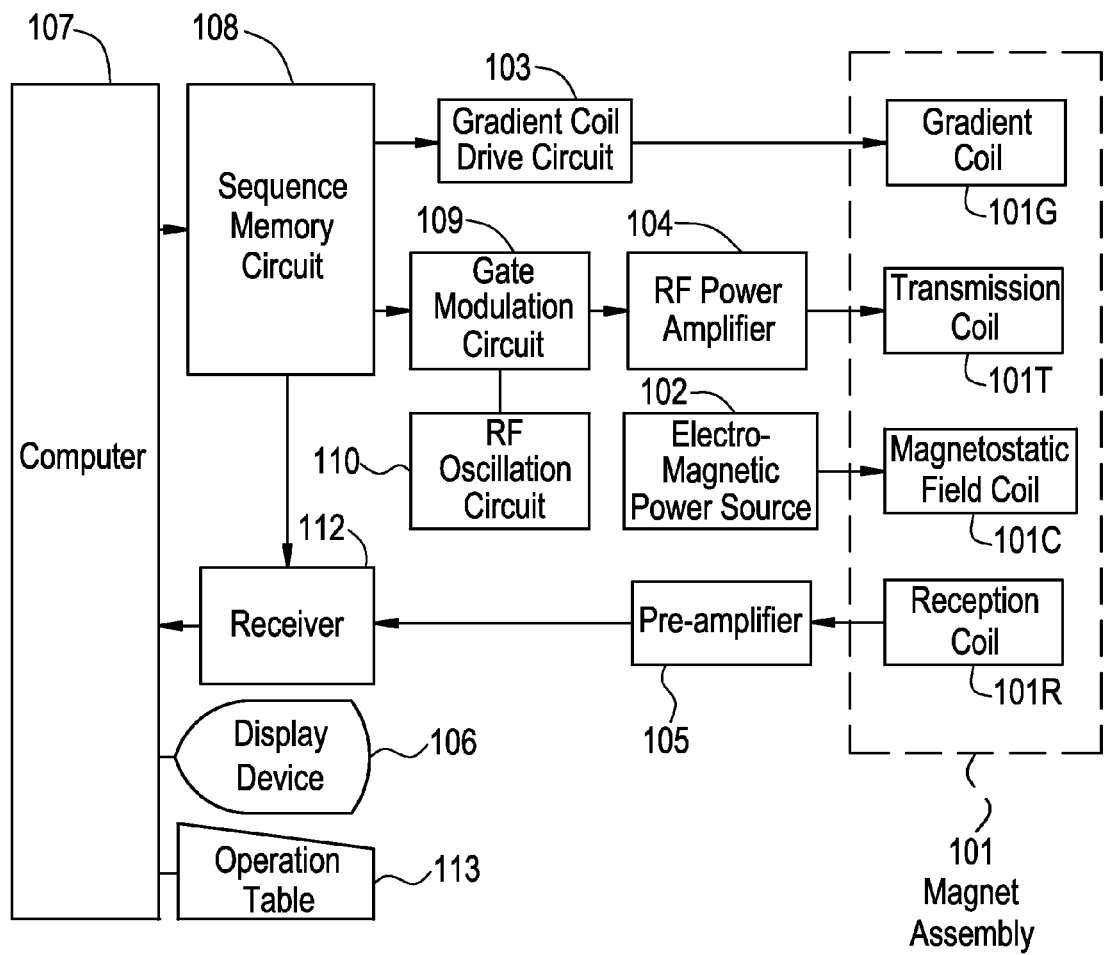
FIG. 1 is a block diagram showing the configuration of an MRI apparatus pertaining to Embodiment 1.

FIG. 1 is a block diagram showing an MRI apparatus 100 pertaining to Embodiment 1.

In this MRI apparatus 100, a magnet assembly 101 has a blank space part (bore) through which a subject is to be inserted into the inside, and a magnetostatic field coil 101C for applying a constant magnetostatic field to a subject, a gradient coil 101G for generating gradient magnetic fields of the X axis, the Y axis and Z axis, a transmission coil 101T to provide an RF pulse for exciting spins of atomic nuclei in the subject, and a reception coil 101R for receiving NMR signals from the subject, so arranged as to surround this blank space part.

Here, both the transmission coil 101T and the reception coil 101R may be body coils, or the transmission coil 101T may be a body coil and the reception coil 101R may be a surface coil.

The magnetostatic field coil 101C, the gradient coil 101G and the transmission coil 101T are respectively connected to an electromagnetic power source 102, a gradient coil drive circuit 103 and an RF power amplifier 104. Also, the reception coil 101R is connected to a pre-amplifier 105.

Incidentally, a permanent magnet may be used in place of the magnetostatic field coil 101C.

A sequence memory circuit 108, in accordance with an instruction from a computer 107, operates the gradient coil drive circuit 103 on the basis of a stored pulse sequence to cause the gradient coil 101G to generate gradient magnetic fields, at the same time operates a gate modulation circuit 109 to modulate carrier output signals of an RF oscillation circuit 110 into pulse-shaped signals of a prescribed timing, a prescribed envelope shape and a prescribed phase, inputs them to the RF power amplifier 104 as RF pulses and, after amplifying their power with the RF power amplifier 104, applies them to the transmission coil 101T.

A receiver 112 converts the NMR signals into digital signals and inputs them to the computer 107.

The computer 107 reads in the digital signals from the receiver 112 and processes them to generate an MR image. Also, the computer 107 takes charge of overall control including reception of information inputted an operation table 113.

A display device 106 displays images and messages.

Figure 2:
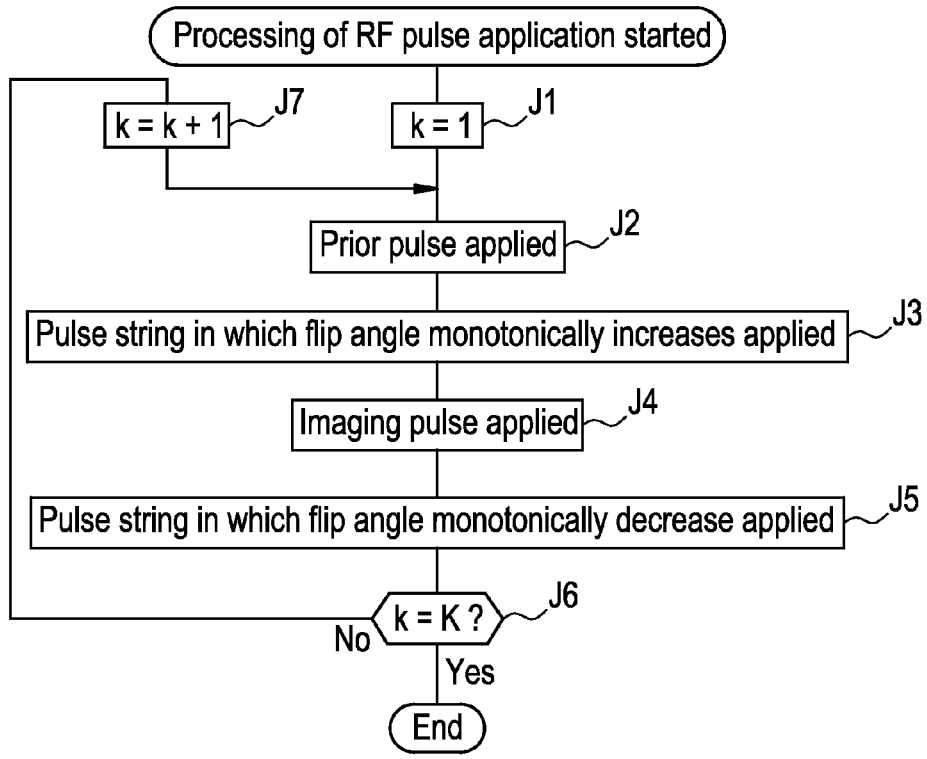
FIG. 2 is a flow chart pertaining to Embodiment 1, showing processing to apply RF pulses.

FIG. 2 is a flow chart pertaining to Embodiment 1, showing processing to apply RF pulses.

At step J1, the count of a repeat counter k is initialized to "1".

Figure 3:
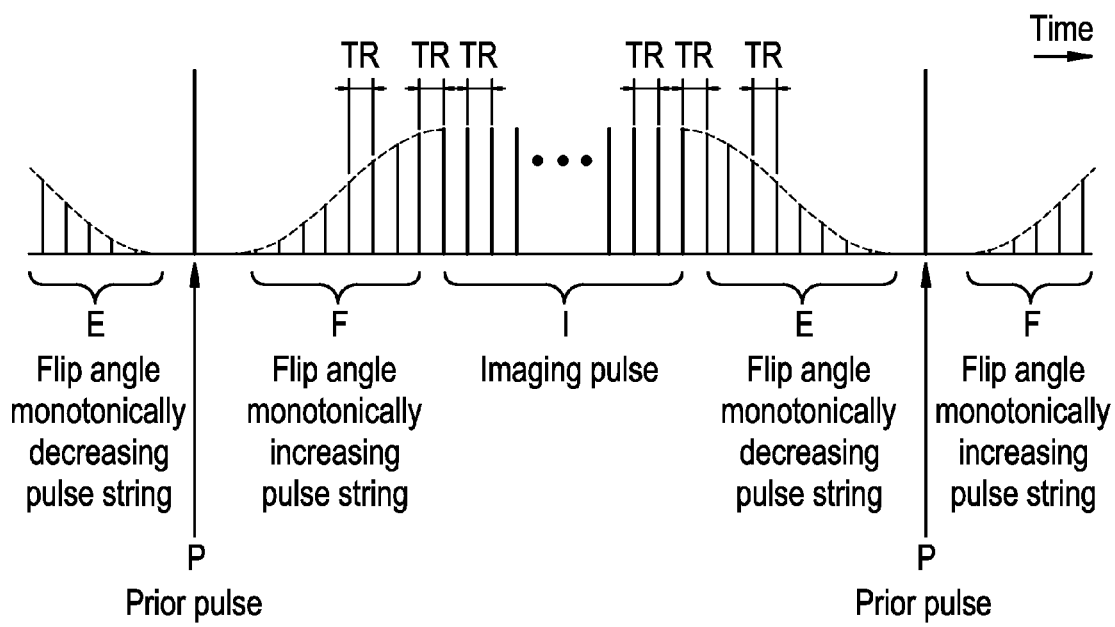
FIG. 3 is a time chart showing the timing of RF pulse application pertaining to Embodiment 1.

At step J2, a prior pulse P shown in FIG. 3 is applied. The prior pulse P is, for instance, a SPEC-IR pulse.

At step J3, a pulse string F in which the flip angle monotonically increases as shown in FIG. 3 is applied.

At step J4, an imaging pulse I shown in FIG. 3 is applied. And data for imaging are colleted. The pulse sequence in which these data for imaging are collected is a pulse sequence of SSFP for instance.

At step J5, a pulse string E in which the flip angle monotonically decreases as shown in FIG. 3 is applied.

At step J6, if the count of the counter k has reached a planned repetition number K, the processing to apply RF pulses will be ended or, if it has not, the processing will move ahead to step J7.

At step J7, the count of the counter k will be incremented by "1", and the processing will return to step J2.

Here, with the repeating period of the imaging pulse I being represented by TR, the flip angle by a and the number of pulses of the pulse string E by N, the repeating period of the pulse string E is also supposed to be TR and the interval between the imaging pulse I and the pulse string E also to be TR. And when the pulses of the pulse string E are sequentially assigned numbers 1 through N, the flip angle $\beta_j$ of the j-th pulse is supposed to be $\beta_j = \alpha[1-\sin\{\pi\cdot(j-1)/N - \pi/2\}]/2$ for instance.

On the other hand, the pulse string F is supposed to be a version of the pulse string E inverted in terms of time.

By the MRI apparatus 100 of Embodiment 1, the following effects can be achieved.

(1) Since the pulse string E which monotonically decreases the flip angle is inserted between the prior pulse P in one round and the imaging pulse I in the previous round, a return from the steady state to the equilibrium state can be achieved not only for on-resonance magnetization but also for off-resonance magnetization before the prior pulse is applied (it was confirmed by simulation). Therefore, the effects of the prior pulse P can be fully attained. Suppression of the loss of signals from water or signals from fat can well be achieved by the prior pulse P.

(2) Since the pulse string F which monotonically increases the flip angle is inserted between the prior pulse P and the imaging pulse I in one round, not only on-resonance magnetization but also off-resonance magnetization can be brought close to the steady state before the imaging pulse I is applied (it was confirmed by simulation).

Embodiment 2

Figure 4:
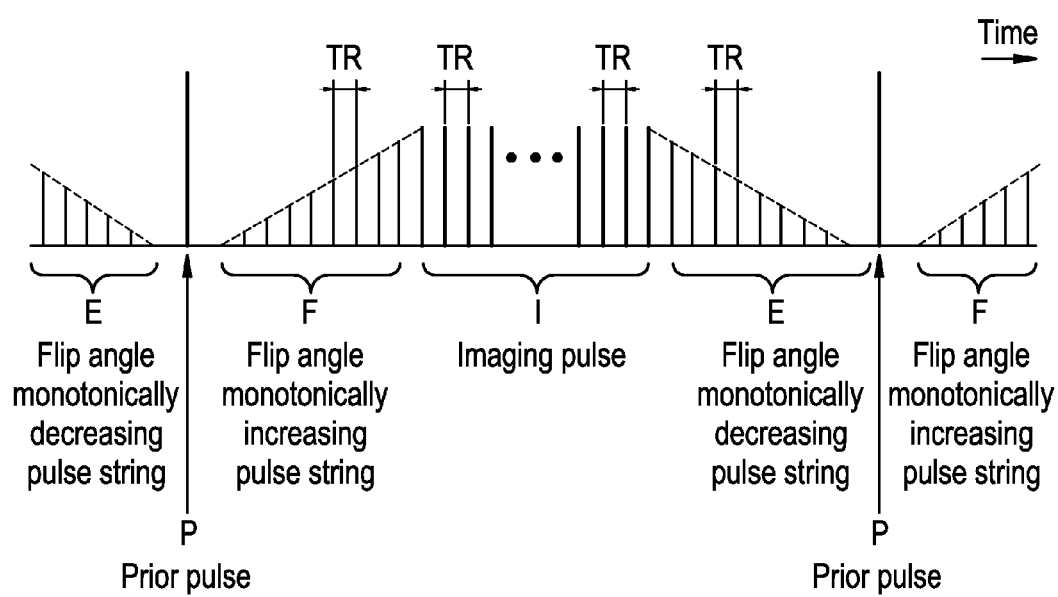
FIG. 4 is a time chart showing the timing of RF pulse application pertaining to Embodiment 2.

The flip angle may as well be decreased linearly with the pulse string E as shown in FIG. 4. In this case, too, the pulse string F is supposed to be a version of the pulse string E inverted in terms of time.

Embodiment 3

The present invention can also be applied where the prior pulse is an IR pulse or a Spatial-Sat pulse.

Many widely different embodiments of the invention may be configured without departing from the spirit and the scope of the present invention. It should be understood that the present invention is not limited to the specific embodiments described in the specification, except as defined in the appended claims.

The invention claimed is:

1. An RF pulse applying method, wherein collection of data for imaging is repeated by applying an imaging pulse after the application of each prior pulse of a plurality of prior pulses, inserting a flip angle monotonically decreasing pulse string that monotonically decreases a flip angle between a first imaging pulse and a first prior pulse that follows said first imaging pulse.

2. The RF pulse applying method according to claim 1, wherein said flip angle monotonically decreasing pulse string is a pulse string which decreases the flip angle modestly in a first phase, decreases the flip angle substantially in a middle phase and decreases the flip angle modestly in a last phase.

3. The RF pulse applying method according to claim 1, wherein said flip angle monotonically decreasing pulse string is a pulse string which linearly decreases the flip angle.

4. The RF pulse applying method according to claim 1, wherein a flip angle monotonically increasing pulse string which monotonically increases the flip angle is inserted between a second prior pulse and said first imaging pulse that follows said second prior pulse.

5. The RF pulse applying method according to claim 4, wherein the flip angle increasing pattern of said flip angle monotonically increasing pulse string is symmetric to the flip angle decreasing pattern of said flip angle monotonically decreasing pulse string.

6. The RF pulse applying method according to claim 1, wherein said plurality of prior pulses are SPEC-IR pulses.

7. The RF pulse applying method according to claim 6, wherein said first imaging pulse is an RF pulse of an SSFP sequence.

8. The RF pulse applying method according to claim 1, wherein said plurality of prior pulses are IR pulses.

9. The RF pulse applying method according to claim 1, wherein said plurality of prior pulses are Spatial-Sat pulses.

10. The RF pulse applying method according to claim 1, wherein said method facilitates enhancing an effect of each of said plurality of prior pulses.

11. The RF pulse applying method according to claim 1, wherein the data is collected only during at least one imaging pulse.

12. An MRI apparatus comprising:
a prior pulse applying device which applies a plurality of prior pulses;
an imaging pulse applying device which applies an imaging pulse after each prior pulse of said plurality of prior pulses; and
a flip angle monotonically decreasing pulse string applying device that applies a flip angle monotonically decreasing pulse string that monotonically decreases a flip angle between a first imaging pulse and a first prior pulse that follows said first imaging pulse.

13. The MRI apparatus according to claim 12, wherein said flip angle monotonically decreasing pulse string applying device decreases the flip angle modestly in a first phase, decreases the flip angle substantially in a middle phase and decreases the flip angle modestly in a last phase.

14. The MRI apparatus according to claim 12, wherein said flip angle monotonically decreasing pulse string applying device linearly decreases the flip angle.

15. The MRI apparatus according to claim 12, comprising a flip angle monotonically increasing pulse string applying device that applies a flip angle monotonically increasing pulse string that monotonically increases the flip angle between a second prior pulse and said first imaging pulse that follows said second prior pulse.

16. The MRI apparatus according to claim 15, wherein the flip angle increasing pattern of said flip angle monotonically increasing pulse string is symmetric to the flip angle decreasing pattern of said flip angle monotonically decreasing pulse string.

17. The MRI apparatus according to claim 12, wherein said plurality of prior pulses comprises one of SPEC-IR pulses, IR pulses, and Spatial-Sat pulses.

18. The MRI apparatus according to claim 17, wherein said first imaging pulse is an RF pulse of an SSFP sequence.

19. The MRI apparatus according to claim 12, wherein the flip angle is a flip angle of an excitation pulse.

20. The MRI apparatus according to claim 12, wherein said flip angle monotonically decreasing pulse string decreases the flip angle to zero.

* * * * *